United States Patent
Lin et al.

(10) Patent No.: US 10,693,030 B2
(45) Date of Patent: Jun. 23, 2020

(54) SOLAR CELL

(71) Applicant: Industrial Technology Research Institute, Hsinchu (TW)

(72) Inventors: Chao-Cheng Lin, Taichung (TW); Chorng-Jye Huang, Hsinchu (TW); Chen-Cheng Lin, Nantou County (TW); Chun-Heng Chen, Taipei (TW); Chen-Hsun Du, Taipei (TW); Chun-Ming Yeh, Taipei (TW); Jui-Chung Hsiao, New Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 52 days.

(21) Appl. No.: 15/871,068

(22) Filed: Jan. 15, 2018

(65) Prior Publication Data

US 2019/0221701 A1    Jul. 18, 2019

(51) Int. Cl.
*H01L 31/0747*    (2012.01)
*H01L 31/0224*    (2006.01)
*H01L 31/074*    (2012.01)
*H01L 31/18*    (2006.01)
*H01L 31/068*    (2012.01)
(Continued)

(52) U.S. Cl.
CPC .... *H01L 31/0747* (2013.01); *H01L 31/02167* (2013.01); *H01L 31/022441* (2013.01); *H01L 31/022466* (2013.01); *H01L 31/022475* (2013.01); *H01L 31/03682* (2013.01); *H01L 31/0682* (2013.01); *H01L 31/074* (2013.01); *H01L 31/1804* (2013.01); *H01L 31/1872* (2013.01); *H01L 31/1884* (2013.01)

(58) Field of Classification Search
None
See application file for complete search history.

(56) References Cited

U.S. PATENT DOCUMENTS 9,716,204 B2    7/2017    Feldmann
2011/0297227 A1    12/2011    Pysch et al.
(Continued)

FOREIGN PATENT DOCUMENTS

| CN | 103985773 | 8/2014 |
| DE | 102013219564 | 4/2015 |
| TW | I485876 | 5/2015 |

OTHER PUBLICATIONS

Bénédicte Demaurex, et al., "Atomic-Layer-Deposited Transparent Electrodes for Silicon Heterojunction Solar Cells," IEEE Journal of Photovoltaics, vol. 4, No. 6, Nov. 2014, pp. 1387-1396.

*Primary Examiner* — Shannon M Gardner

(74) *Attorney, Agent, or Firm* — JCIPRNET

(57) ABSTRACT

A solar cell includes a photoelectric conversion layer, a doped layer, a first passivation layer, a first TCO layer, a front electrode and a back electrode. The doped layer is disposed on the front surface of the photoelectric conversion layer. The first passivation layer is disposed on the doped layer, wherein the first passivation layer has a plurality of openings exposing a portion of the doped layer. The first TCO layer is disposed on the first passivation layer and in the openings, and directly contacts the exposed doped layer via the openings, wherein a ratio of an area of the openings to an area of the first TCO layer is between 0.01 and 0.5. The front electrode is disposed on the first TCO layer. The back electrode is disposed on the back surface of the photoelectric conversion layer.

11 Claims, 2 Drawing Sheets

(51) Int. Cl.
*H01L 31/0368* (2006.01)
*H01L 31/0216* (2014.01)

(56) References Cited

U.S. PATENT DOCUMENTS

2014/0283902  A1    9/2014   Heng et al.
2016/0072000  A1    3/2016   Smith

SOLAR CELL

TECHNICAL FIELD

The disclosure relates to a heterojunction solar cell.

BACKGROUND

Tunneling solar cells currently under development (e.g., heterojunction silicon solar cells) is known to its high efficiency with its power generation significantly improved for reducing power generation costs.

During a manufacturing process for a common heterojunction silicon solar cell, a transparent conductive oxide (TCO) layer is formed on a polycrystalline silicon surface served as a passivation layer for electric conduction, and yet, deposition of the TCO layer can cause damages on the polycrystalline silicon surface such that a passivation effect is lowered instead. Accordingly, to prevent aforesaid issue, currently, a buffer layer is formed on the polycrystalline silicon surface in advance. However, equipments for forming such buffer layer are different from equipments for deposition of the TCO layer, thereby increasing equipment costs.

Therefore, it is necessary to develop a solar cell capable of reducing damages caused by deposition of the TCO layer while improving overall efficiency of the solar cell.

SUMMARY

The disclosure is directed to a solar cell, which has a structure with the consideration of light absorption and the passivation effect and is capable of further improving its short circuit current, open circuit voltage and conversion efficiency.

The solar cell of the disclosure includes a photoelectric conversion layer, a doped layer, a first passivation layer, a first transparent conductive oxide layer, a front electrode and a back electrode. The doped layer is disposed on the front surface of the photoelectric conversion layer. The first passivation layer is disposed on the doped layer. The first passivation layer has a plurality of openings, and the openings expose a portion of the doped layer. The first transparent conductive oxide layer is disposed on the first passivation layer and in the openings, and directly contacts the exposed doped layer via the openings, wherein a ratio of an area of all of the openings to an area of the first transparent conductive oxide layer is between 0.01 and 0.5. The front electrode is disposed on the first transparent conductive oxide layer, and the back electrode is disposed on the back surface of the photoelectric conversion layer.

Based on the above, with the passivation layer having the openings and a specific area ratio of the openings to the transparent conductive oxide layer, the passivation effect is improved and the short circuit current is increased so an overall efficiency of the solar cell can be improved.

Several exemplary embodiments accompanied with figures are described in detail below to further describe the disclosure in details.

DETAILED DESCRIPTION

Figure 1A:
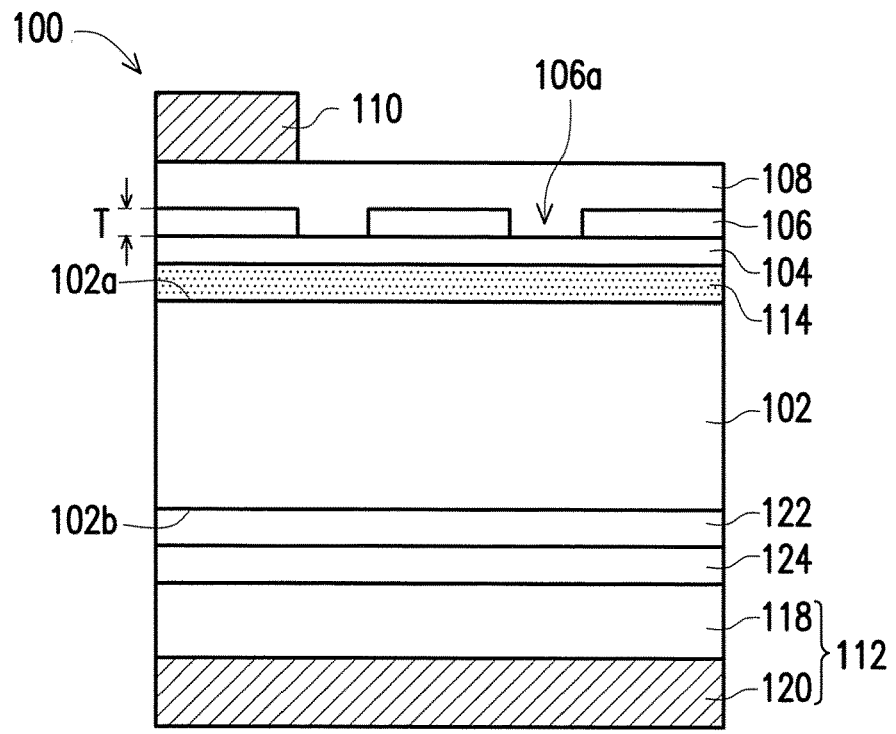
FIG. 1A is a schematic diagram of a solar cell according to an embodiment of the disclosure.

A description accompanied with embodiments and drawings is provided in the following to sufficiently explain the present disclosure. However, it is noted that the present disclosure may still be implemented in many other different forms and should not be construed as limited to the embodiments described hereinafter. In the drawings, the various components and their respective sizes are not drawn to scale for clarity.

FIG. 1A is a schematic diagram of a solar cell according to an embodiment of the disclosure.

With reference to FIG. 1A, a solar cell 100 of the present embodiment at least includes a photoelectric conversion layer 102, a doped layer 104, a first passivation layer 106, a first transparent conductive oxide (TCO) layer 108, a front electrode 110 and a back electrode 112. The photoelectric conversion layer 102 has a front surface 102a and a back surface 102b. A material of the photoelectric conversion layer 102 is, for example, silicon carbide (SiC), silicon (Si), cadmium sulfide (CdS), copper indium gallium diselenide (Cu(In,Ga)Se2), copper indium diselenide (Cu(In)Se2), cadmium telluride (CdTe) or an organic material. The doped layer 104 is disposed on the front surface 102a of the photoelectric conversion layer 102, wherein a material of the doped layer 104 is, for example, a doped polycrystalline silicon, a doped amorphous silicon or a doped monocrystalline silicon. An element doped in the doped layer 104 is, for example, trivalent element such as aluminum, boron, gallium, etc.; or pentavalent element such as arsenic, phosphorus, antimony, etc.

In FIG. 1A, the first passivation layer 106 is disposed above the doped layer 104, and the first passivation layer 106 has a plurality of openings 106a; wherein a thickness T of the first passivation layer 106 is approximately tens of nanometers (e.g., between 10 nm and 100 nm); In another embodiment, the thickness T of the first passivation layer 106 is between 30 nm and 55 nm. A material of the first passivation layer 106 is, for example, $SiN_x$, SiON, $SiO_2$, $Al_2O_3$, $HfO_2$, $ZrO_2$ or an amorphous silicon (a-Si), wherein $x \leq 4/3$. Also, the openings 106a expose a portion of the doped layer 104.

In the present embodiment, the first transparent conductive oxide layer 108 is disposed above the first passivation layer 106. Here, a material of the first transparent conductive oxide layer 108 is, for example, indium tin oxide (ITO), indium zinc oxide (IZO), Al-doped ZnO (AZO), Ga-doped zinc oxide (GZO), indium oxide ($In_2O_3$), zinc oxide (ZnO), titanium dioxide ($TiO_2$), tin dioxide ($SnO_2$) or other transparent conductive oxide materials. Further, the first transparent conductive oxide layer 108 passes through each of the openings 106a and directly contacts the exposed doped layer 104. In the present embodiment, an area ratio of all of the openings 106a to the first transparent conductive oxide layer 108 is between 0.01 and 0.5. The damages caused by plasma bombarded on the doped layer 104 for deposition of the first transparent conductive oxide layer 108 may be reduced when said area ratio is 0.01 or more; increases in the short circuit current of the solar cell 100 may be ensured when said area ratio is 0.5 or less. Herein, so-called "area ratio" refers to a sum of areas of the openings 106a divided by the area of first transparent conductive oxide layer 108. The front electrode 110 is disposed on the first transparent conductive oxide layer 108, wherein the front electrode 110 is a metal electrode made of, for example, Al, Ag, Mo, Au, Pt, Ni or Cu, and formed through the manufacturing processes of sputtered coating, electro-plating or coating (e.g., a screen printing). The back electrode 112 is disposed on the back surface 102b of the photoelectric conversion layer 102.

Figure 1B:
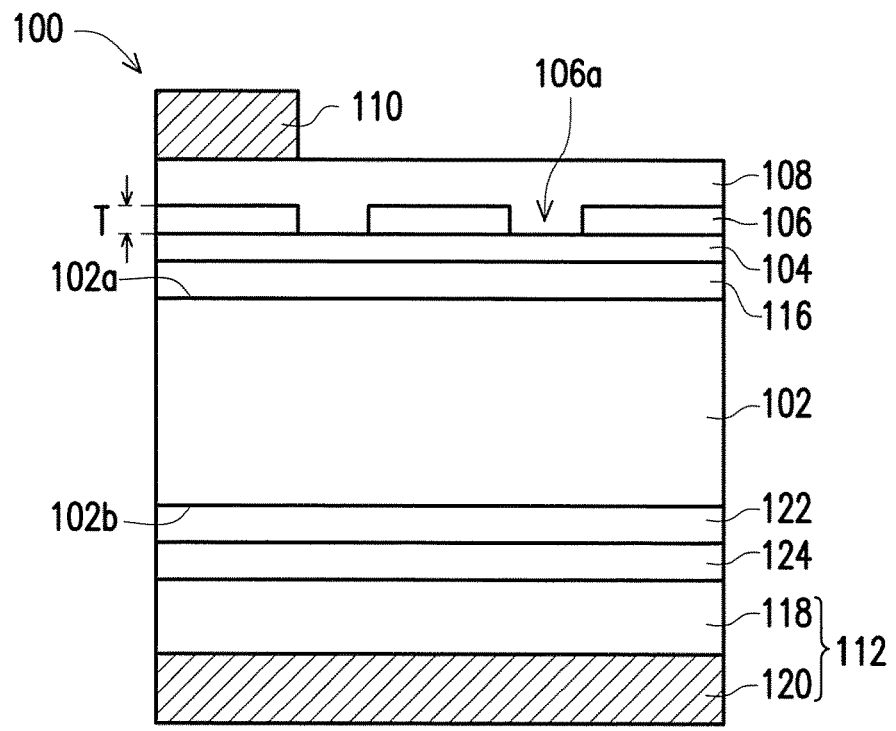
FIG. 1B is a schematic diagram of another modification of the solar cell in the embodiment.

With reference to FIG. 1A, because the tunneling solar cell is taken as an example in the present embodiment, a first tunneling layer 114 may be further included between the photoelectric conversion layer 102 and the doped layer 104. A material of the first tunneling layer 114 may be, for example, $SiO_2$, SiON, $Al_2O_3$ or SiN, and the doped layer 104 is a doped polycrystalline silicon layer. However, the disclosure is not limited to the above. For example, FIG. 1B illustrates a modification of the embodiment. In FIG. 1B, a structural difference compared to FIG. 1A is that, an intrinsic amorphous silicon layer 116 is provided between the photoelectric conversion layer 102 and the doped layer 104, and the doped layer 104 is a doped amorphous silicon layer. Here, an element doped in the doped layer 104 is, for example, trivalent element such as aluminum, boron, gallium, etc.; or pentavalent element such as arsenic, phosphorus, antimony, etc. In other words, a structure between the photoelectric conversion layer 102 and the doped layer 104 may be modified based on demand, rather than being limited by what illustrated in FIG. 1A and FIG. 1B.

With reference to FIG. 1A again, the back electrode 112 is, for example, a combination of a second transparent conductive oxide layer 118 and a metal electrode 120. Here, the second transparent conductive oxide layer 118 is disposed between the photoelectric conversion layer 102 and the metal electrode 120. A material of the second transparent conductive oxide layer 118 may be identical to or different from that of the first transparent conductive oxide layer 108, and a material of the metal electrode 120 may be identical to or different from that of the front electrode 112. In addition, because the present embodiment takes a heterojunction tunneling solar cell as an example, a second tunneling layer 122 may be further disposed between the back surface 102b of the photoelectric conversion layer 102 and the second transparent conductive oxide layer 118, and a material of the second tunneling layer 122 may be identical to or different from that of the first tunneling layer 114 (e.g., silicon oxide, silicon oxynitride, aluminum oxide or silicon nitride). Moreover, a second passivation layer 124 may be further disposed between the second transparent conductive oxide layer 118 and the second tunneling layer 122 to ensure the passivation effect, and a material of the second passivation layer 124 may be identical to or different from that of the first passivation layer 106 (e.g., $SiN_x$, SiON, $SiO_2$, $Al_2O_3$, $HfO_2$, $ZrO_2$ or an amorphous silicon (a-Si), wherein x≤4/3).

Experiments are provided below for verifying effects of the disclosure, but the scope of the disclosure is not limited by the following contents.

<Simulation Experiment 1>

The solar cell in Simulation Experiment 1 is similar to what illustrated in FIG. 1A, in which the first transparent conductive oxide layer and the second transparent conductive oxide layer in the back electrode are both the indium tin oxide (ITO); the first and second passivation layers are both $SiN_x$, the doped layer is the doped polycrystalline silicon; the first and second tunneling layers are both $SiO_2$; and the front electrode and the metal electrode in the back electrode are both Ag. The simulation is conducted by varying the ratio of the area of the openings to the area of the first transparent conductive oxide layer so as to analyze effects of the area ratio to the solar cell, and the result is shown in FIG. 2.

In the simulation process, first of all, without taking optical effects into consideration (the first passivation layer is absent; i.e. the area ratio is 0), a simulated efficiency is increased to 106%.

Subsequently, with optical effects taken into consideration (the first passivation layer is provided; and the area ratio is, for example, 0.05), contribution from the openings (with only ITO as an anti-reflection layer)=0.05×106%=5.3%; contribution from non-opening region (ITO and SiNx)=(1−0.05)×106%×95%/93.6%=102.2%. Accordingly, a total efficiency is increased to: (5.3+102.2)%=107.5%.

Figure 2:
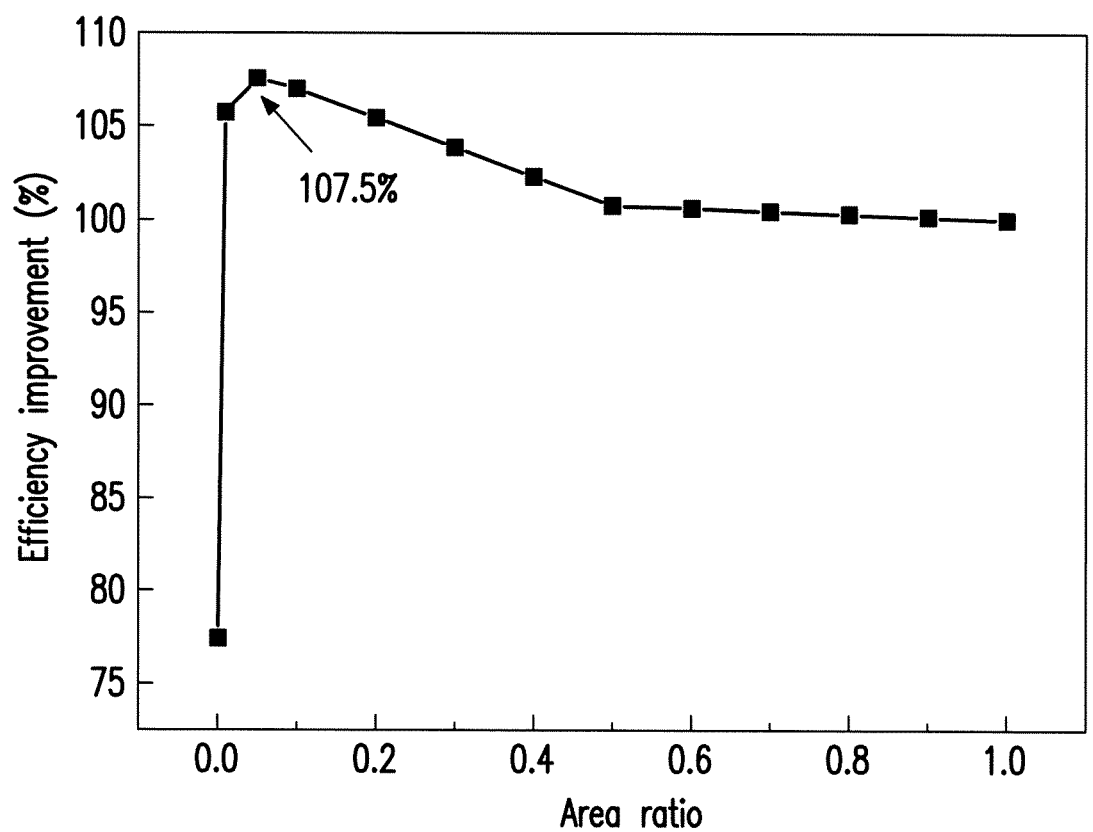
FIG. 2 is a curve diagram of an area ratio of the openings to the first transparent conductive oxide layer versus a photoelectric conversion efficiency improvement in the solar cell of Simulation Experiment 1.

In view of FIG. 2, as long as the area ratio is 0.01 or more, the solar cell efficiency is increased. Also, a significant efficiency improvement is present when the area ratio is between 0.01 and 0.5. If the area ratio is 0.05, a specific ratio of the improved solar cell efficiency can reach as high as 107.5%.

<Simulation Experiment 2>

Here, the solar cell of Simulation Experiment 1 is taken as a simulation target, and the ratio of the area of the openings to the area of the first transparent conductive oxide layer is fixed to 0.05. Subsequently, as similar to Simulation Experiment 1, a simulation is conducted with the thickness of the first transparent conductive oxide layer fixed at 40 nm and the thickness of the first passivation layer changed in accordance with Table 1 below, and the result is also shown in Table 1 below.

Simulation Comparative Example

Here, a simulation identical to the simulation of Simulation Experiment 2 is conducted without having the first passivation layer (SiNx) in the solar cell but simple changing the thickness of the first transparent conductive oxide layer (ITO) for analysis, the result is shown in Table 2 below.

Table 1 summarizes values of photo current in terms of a reflection percentage ($J_R$), an ITO absorption percentage ($J_A$) and an actual photoelectric conversion layer (silicon substrate) absorption percentage ($J_G$) with the first transparent conductive oxide layer (ITO) at the thickness of 40 nm and the first passivation layer (SiNx) at different thicknesses.

TABLE 1

| SiNx thickness (nm) | $J_R$ (%) | $J_A$ (%) | $J_G$ (%) |
|---|---|---|---|
| 30 | 2.80 | 2.40 | 94.80 |
| 35 | 2.60 | 2.50 | 94.90 |
| 40 | 2.50 | 2.60 | 95.00 |
| 45 | 2.40 | 2.70 | 95.00 |
| 50 | 2.30 | 2.70 | 94.90 |
| 55 | 2.30 | 2.80 | 94.90 |

ITO thickness is 40 nm.

Table 2 summarizes values of photo current in teams of a reflection percentage ($J_R$), an ITO absorption percentage ($J_A$) and an actual silicon substrate absorption rate ($J_G$) with the first transparent conductive oxide layer (ITO) at different thicknesses.

TABLE 2

| ITO thickness (nm) | $J_R$ (%) | $J_A$ (%) | $J_G$ (%) |
|---|---|---|---|
| 35 | 6.50 | 1.50 | 92.00 |
| 40 | 5.70 | 1.70 | 92.50 |

TABLE 2-continued

| ITO thickness (nm) | $J_R$ (%) | $J_A$ (%) | $J_G$ (%) |
|---|---|---|---|
| 45 | 5.00 | 2.00 | 93.00 |
| 50 | 4.50 | 2.30 | 93.30 |
| 55 | 4.00 | 2.50 | 93.50 |
| 60 | 3.60 | 2.80 | 93.60 |
| 65 | 3.30 | 3.10 | 93.60 |
| 70 | 3.10 | 3.40 | 93.50 |
| 75 | 2.90 | 3.70 | 93.30 |
| 80 | 2.90 | 4.10 | 93.10 |
| 85 | 2.80 | 4.40 | 92.80 |

In view of Table 1 and Table 2, the main difference between Simulation Experiment 2 and Simulation Comparative Example is the actual silicon substrate absorption rate, which is between 92% and 94% for Simulation Comparative Example and 94% or more for Simulation Experiment 2 where it can reach 95%. Also, under the same thickness condition (e.g., SiNx thickness being 40 nm (ITO thickness being 40 nm) in Table 1 and ITO thickness being 80 nm in Table 2), it can be observed that both the reflection percentage and the ITO absorption percentage for the photo current are significantly reduced so the efficiency improvement can reach 95.00%, which is increased by 1.9% overall. This result indicates that, with the passivation layer having openings, the structure of the disclosure can improve the conversion efficiency for the solar cell.

Experimental Example

One solar cell of Simulation Experiment 1 is practically manufactured with the thickness of the first transparent conductive oxide layer (ITO) being 40 nm and the thickness of the first passivation layer ($SiN_x$) being 40 nm. Then, an implied open circuit voltage ($iV_{OC}$) and a silicon substrate absorption rate before and after ITO is formed are practically measured, and the result is shown in Table 3 below.

Reference Example

One solar cell of Simulation Comparative Example is practically manufactured with the thickness of the first transparent conductive oxide layer (ITO) being 65 nm. Then, an implied open circuit voltage ($iV_{OC}$) and a silicon substrate absorption rate before and after ITO is formed are practically measured, and the result is shown in Table 3 below.

TABLE 3

|  | Reference Example | Experimental Example |
|---|---|---|
| iVoc (before ITO is formed) | 697 mV | 697 mV |
| iVoc (after ITO is formed) | 674 mV | 707 mV |
| Simulated Absorption Rate | 93.6% | 95% |

In view of Table 3, the structure of the disclosure can provide more preferable passivation effect and optical characteristics.

In summary, with the passivation layer having the openings and the specific area ratio of the openings to the transparent conductive oxide layer provided by the disclosure, not only are the damages caused by plasma bombarded on the doped layer be reduced, the benefit of improved passivation effect and increased optical absorption are also provided such that the solar cell with aforesaid structure can provide a high conversion efficiency accordingly.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A solar cell, comprising:
   a photoelectric conversion layer, having a front surface and a back surface;
   a doped layer, disposed on the entire front surface of the photoelectric conversion layer;
   a first passivation layer, disposed on the entire doped layer, wherein the first passivation layer has a plurality of openings, and the openings expose a portion of the doped layer;
   an intrinsic amorphous silicon layer, disposed between the entire front surface of the photoelectric conversion layer and the entire doped layer;
   a first transparent conductive oxide layer, disposed on the entire first passivation layer and in all of the openings, and directly contacting the exposed doped layer via the openings, wherein a ratio of an area of the openings to an area of the first transparent conductive oxide layer is between 0.01 and 0.5;
   a front electrode, disposed on the first transparent conductive oxide layer; and
   a back electrode, disposed on the back surface of the photoelectric conversion layer.

2. The solar cell according to claim 1, wherein a material of the doped layer comprises a doped polycrystalline silicon, a doped amorphous silicon or a doped monocrystalline silicon.

3. The solar cell according to claim 1, wherein a material of the first passivation layer comprises $SiN_x$, SiON, $SiO_2$, $AlO_3$, $HfO_2$, $ZrO_2$ or amorphous silicon (a-Si), wherein $x \leq 4/3$.

4. The solar cell according to claim 1, wherein a thickness of the first passivation layer is between 10 nm and 100 nm.

5. The solar cell according to claim 1, wherein a material of the front electrode comprises a metal.

6. The solar cell according to claim 1, wherein the back electrode comprises a second transparent conductive oxide layer and a metal electrode, wherein the second transparent conductive oxide layer is disposed between the back surface of the photoelectric conversion layer and the metal electrode.

7. The solar cell according to claim 6, further comprising a second tunneling layer, disposed between the back surface of the photoelectric conversion layer and the second transparent conductive oxide layer.

8. The solar cell according to claim 7, wherein a material of the second tunneling layer comprises silicon oxide, silicon oxynitride, aluminum oxide or silicon nitride.

9. The solar cell according to claim 7, further comprising a second passivation layer, disposed between the second tunneling layer and the second transparent conductive oxide layer.

10. The solar cell according to claim 9, wherein a material of the second passivation layer comprises $SiN_x$, SiON, $SiO_2$, $Al_2O_3$, $HfO_2$, $ZrO_2$ or a-Si, wherein $x \leq 4/3$.

11. The solar cell according to claim 1, wherein a material of the photoelectric conversion layer comprises silicon carbide (SiC), silicon (Si), cadmium sulfide (CdS), copper indium gallium diselenide (Cu(In,Ga)Se2), copper indium diselenide (Cu(In)Se2), cadmium telluride (CdTe) or an organic material.

* * * * *